(12) United States Patent (10) Patent No.: US 12,621,961 B2

Sasaki (45) Date of Patent: May 5, 2026

(54) ELECTRONIC DEVICE AND PRODUCT

(71) Applicant: Beji Sasaki, Tokyo (JP)

(72) Inventor: Beji Sasaki, Tokyo (JP)

( * ) Notice: Subject to any disclaimer, the term of this patent is extended or adjusted under 35 U.S.C. 154(b) by 162 days.

(21) Appl. No.: 18/261,994

(22) PCT Filed: Jan. 19, 2022

(86) PCT No.: PCT/JP2022/001730
§ 371 (c)(1),
(2) Date: Sep. 22, 2023

(87) PCT Pub. No.: WO2022/158474
PCT Pub. Date: Jul. 28, 2022

(65) Prior Publication Data
US 2024/0090175 A1 Mar. 14, 2024

(30) Foreign Application Priority Data
Jan. 19, 2021 (JP) ................................. 2021-006590

(51) Int. Cl.
*H05K 7/20* (2006.01)
*H05K 1/02* (2006.01)
*H05K 5/00* (2025.01)
*H05K 13/00* (2006.01)

(52) U.S. Cl.
CPC ........... *H05K 7/205* (2013.01); *H05K 1/0209* (2013.01); *H05K 5/006* (2013.01); *H05K 13/0015* (2013.01); *H05K 2201/0212* (2013.01); *H05K 2201/0275* (2013.01)

(58) Field of Classification Search
CPC ..................... H05K 7/20; H05K 7/205; H05K 1/0203–0212; H05K 5/006; H05K 13/0015; H05K 2201/0212; H05K 2201/0275; H01L 23/3128; H01L 23/367–3733; H01L 23/4334; H01L 23/49568; H01L 23/49861
See application file for complete search history.

(56) References Cited

U.S. PATENT DOCUMENTS

| | | | |
|---|---|---|---|
| 5,726,493 A | | 3/1998 | Yamashita et al. |
| 9,852,962 B2 * | | 12/2017 | Temmei .............. H01L 23/3735 |
| 10,392,548 B2 * | | 8/2019 | Maisonnave ............ B32B 5/26 |
| 11,289,889 B2 * | | 3/2022 | Hasegawa ................ H02G 3/30 |

(Continued)

FOREIGN PATENT DOCUMENTS

| | | |
|---|---|---|
| JP | H07-66332 A | 3/1995 |
| JP | 2017139278 A | 8/2017 |

(Continued)

OTHER PUBLICATIONS

International Search Report for PCT Application No. PCT/JP2022/001730 issued on Mar. 22, 2022 and its English Translation provided by WIPO.

(Continued)

*Primary Examiner* — Amir A Jalali

(74) *Attorney, Agent, or Firm* — Ladas & Parry, LLP

(57) ABSTRACT

An electronic device is provided having a device part; an outer housing is provided to cover an upper side of the device part; and the electronic device also has a fiber member for joining the device part to the outer housing. The fiber member is exposed from an upper surface of the outer housing.

8 Claims, 23 Drawing Sheets

(56)     References Cited

U.S. PATENT DOCUMENTS

| | | | |
|---|---|---|---|
| 2010/0264552 A1* | 10/2010 | Nakasato | ............... H01L 24/81 174/266 |
| 2012/0032350 A1 | 2/2012 | Warren | |
| 2012/0061816 A1 | 3/2012 | Song | |
| 2019/0166722 A1 | 5/2019 | Ogura | |
| 2019/0295923 A1* | 9/2019 | Karouji | ............ H01L 23/49568 |
| 2020/0052797 A1 | 2/2020 | Shiraishi | |
| 2020/0325602 A1* | 10/2020 | Rathnayake | ............ D02G 3/36 |
| 2021/0272879 A1 | 9/2021 | Kubo et al. | |
| 2022/0013830 A1* | 1/2022 | Kuwabara | .............. B60L 50/64 |
| 2022/0093992 A1* | 3/2022 | Shimizu | ............. H01M 50/204 |

FOREIGN PATENT DOCUMENTS

| | | | |
|---|---|---|---|
| JP | 2019102485 A | 6/2019 | |
| JP | 2019220615 A | 12/2019 | |
| JP | 2020027846 A | 2/2020 | |
| JP | 2020-064973 A | 4/2020 | |

OTHER PUBLICATIONS

Written Opinion for PCT Application No. PCT/JP2022/001730 issued on Mar. 22, 2022 and its English Translation provided by WIPO.

International Preliminary Report on Patentability for PCT Application No. PCT/JP2022/001730 issued on Jul. 20, 2023 and its English Translation provided by WIPO.

Extended European Search Report for the corresponding European Patent Application No. 22742596.4 issued by the European Patent Office on Jun. 25, 2024.

Office action from corresponding Indian Patent Application No. 202347055387 dated Mar. 19, 2026.

* cited by examiner

FIRST DIRECTION

SECOND DIRECTION

FIRST DIRECTION

SECOND
DIRECTION

FIRST DIRECTION

SECOND
DIRECTION

FIRST DIRECTION

SECOND
DIRECTION

FIRST DIRECTION

SECOND DIRECTION

FIRST DIRECTION

SECOND
DIRECTION

ELECTRONIC DEVICE AND PRODUCT

CROSS-REFERENCE TO RELATED APPLICATIONS

This application is the U.S. national phase of PCT Patent Application No. PCT/JP2022/001730 filed on Jan. 19, 2022, which claims priority to Japanese Patent Application No. 2021-006590, filed on Jan. 19, 2021, the disclosures of which are incorporated in their entireties by reference herein.

TECHNICAL FIELD

The present invention relates to an electronic device having a device part and a product.

BACKGROUND ART

As the power consumption of electronic elements and the like increases, heat dissipation in electronic devices has become important. For example, JP 2019-102485 A discloses an electronic device including a printed circuit board having a surface on which a heating element is mounted, and a sealed housing having thermal conductivity and accommodating the printed circuit board. The electronic device includes a through hole provided in the printed circuit board and a protrusion provided on a surface of the housing that faces a back surface of the printed circuit board, and the protrusion is thermally connected to the heating element via the through hole.

SUMMARY OF INVENTION

Problem to be Solved by Invention

The present invention provides an electronic device and the like for implementing a high heat dissipation performance by an approach different from an aspect according to the related art.

Means for Solving Problem

An electronic device according to an aspect of the present invention may comprise:

a device part; and a fiber member for joining the device part to another member other than the device part included in the electronic device.

According to the present invention, heat generated from the device part can be easily transferred to another member, and the heat can be easily dissipated.

DETAILED DESCRIPTION

Figure 1:
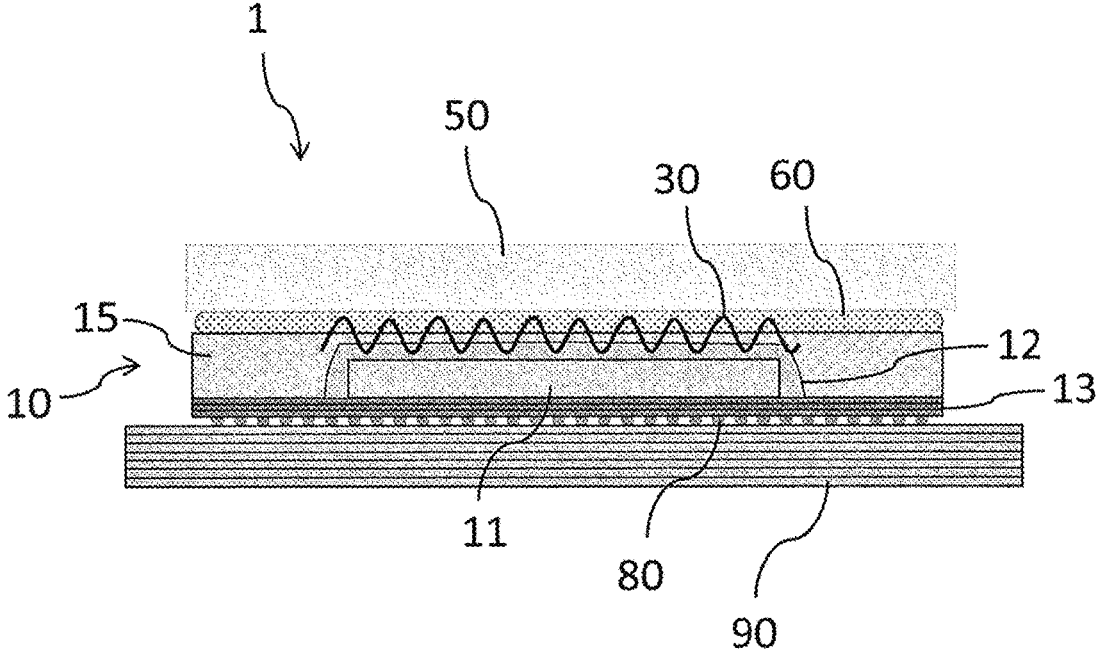
FIG. 1 is a side cross-sectional view illustrating an aspect in which a highly thermally conductive fiber member joins a device part and a heat transfer member in an electronic device according to an embodiment of the present invention.
Figure 1:
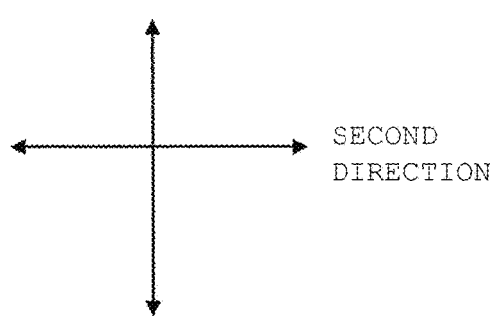

As illustrated in FIG. 1, an electronic device of the present embodiment may have a device part 10 and an outer housing 50 provided in such a way as to cover the device part 10. A fiber member 30 for joining the device part 10 to another member other than the device part 10 included in the electronic device may be provided. The fiber member 30 may be made of metal or may be a copper fiber member made of copper. However, the present invention is not limited thereto, and any member having high conductivity can be preferably used as the fiber member 30. The outer housing 50 may be, for example, a housing of a smartphone, a housing of a personal computer, or the like, or may be a housing of an in-vehicle device.

As described above, by providing the fiber member 30 for joining the device part 10 to another member present between the outer housing 50 and the device part 10, heat generated from the device part 10 can be easily transmitted to the another member, and the heat can be easily dissipated. In particular, in a case where the fiber member 30 is made of metal, high thermal conduction can be implemented, and an excellent dissipation effect can be exhibited.

In FIG. 1, an upper side is one side, and a lower side is the other side. A vertical direction in FIG. 1 is a first direction, a horizontal direction is a second direction, and a front and back direction of a paper surface is a third direction. In the present embodiment, a plane including the second direction and the third direction is referred to as an in-plane.

Figure 4:
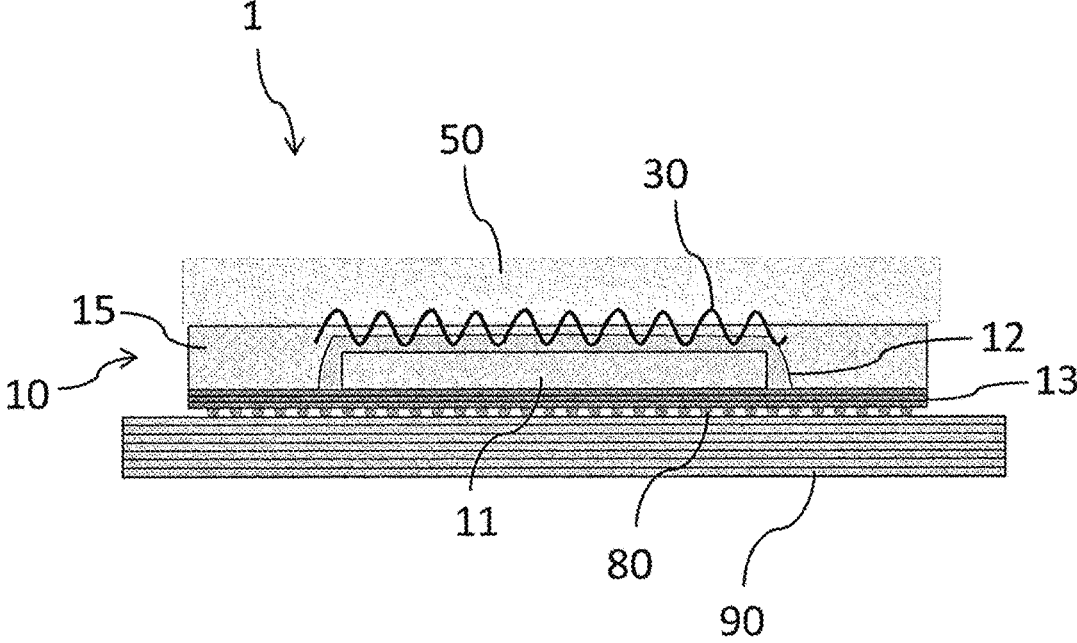
FIG. 4 is a side cross-sectional view illustrating an aspect in which the fiber member joins the device part and the outer housing in the electronic device according to an embodiment of the present invention.
Figure 4:
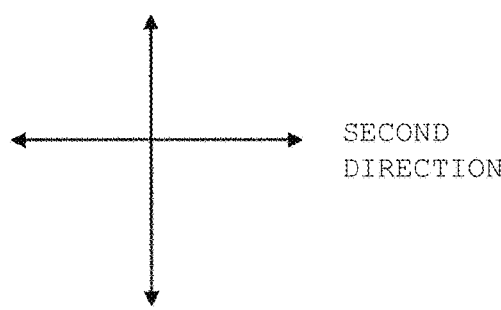

The another member joined by the fiber member 30 may be the outer housing 50. In this case, the fiber member 30 joins the device part 10 and the outer housing 50 by sewing (see FIG. 4). The joining by the fiber member 30 may be implemented by a special sewing machine.

As the fiber member 30 joins the device part 10 and the outer housing 50 in this manner, heat can be transmitted to the outer housing 50 via the fiber member 30. Therefore, a greater heat dissipation effect can be exhibited.

Figure 3:
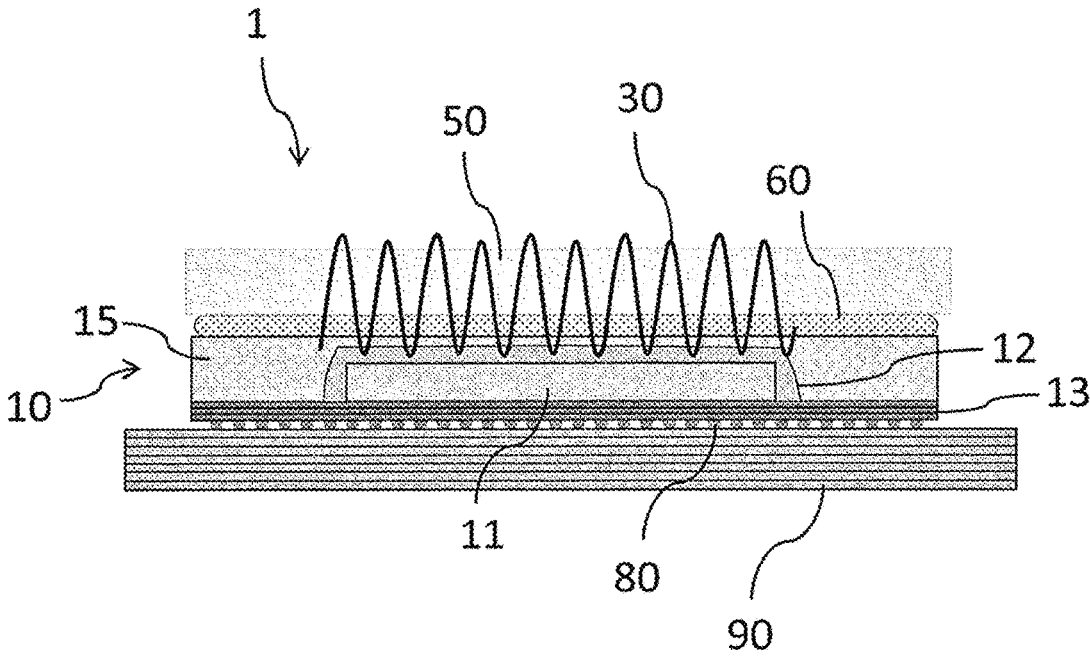
FIG. 3 is a side cross-sectional view illustrating an aspect in which the fiber member penetrates through the outer housing in the electronic device according to an embodiment of the present invention.
Figure 3:
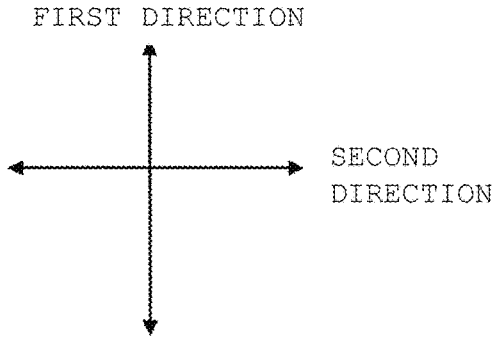

The fiber member 30 may be exposed from one side surface (outer surface) of the outer housing 50 (see FIG. 3). In this case, heat can be transferred to the outside of the outer housing 50 via the fiber member 30.

Therefore, a greater heat dissipation effect can be exhibited. The fiber member 30 may be within the outer housing 50 and does not have to be exposed from the one side surface (outer surface) of the outer housing 50 (see FIG. 2).

Figure 2:
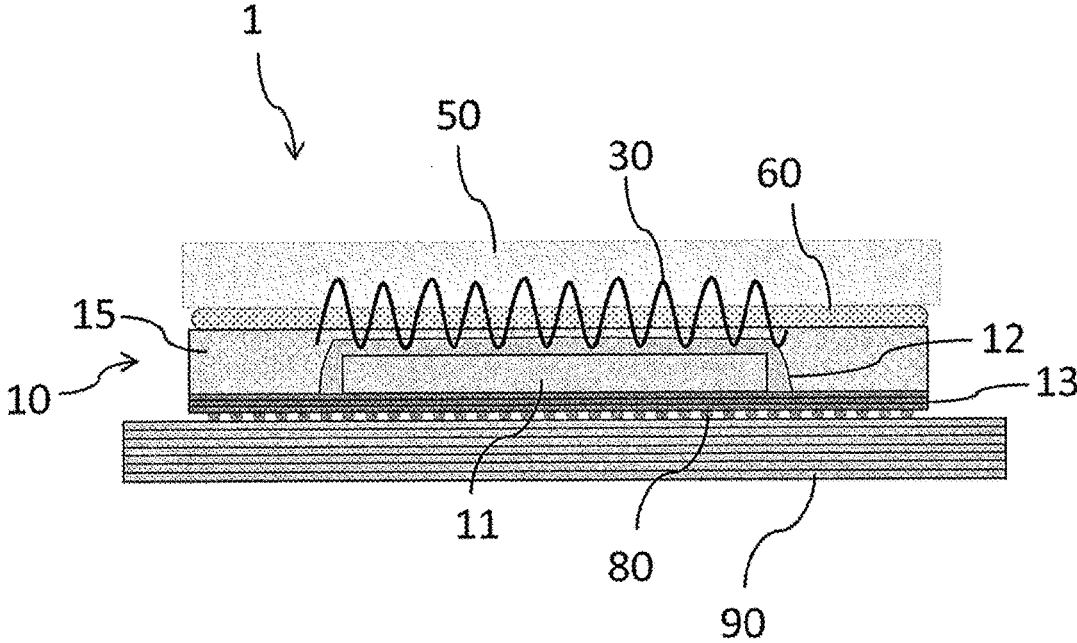
FIG. 2 is a side cross-sectional view illustrating an aspect in which the fiber member joins the device part, the heat transfer member, and an outer housing in the electronic device according to an embodiment of the present invention.
Figure 2:
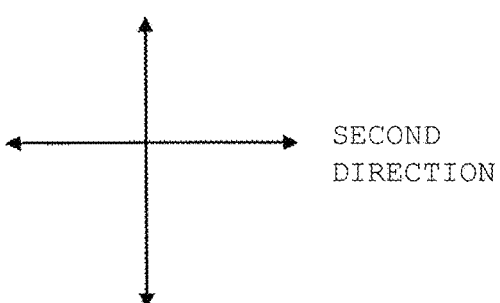
Figure 11:
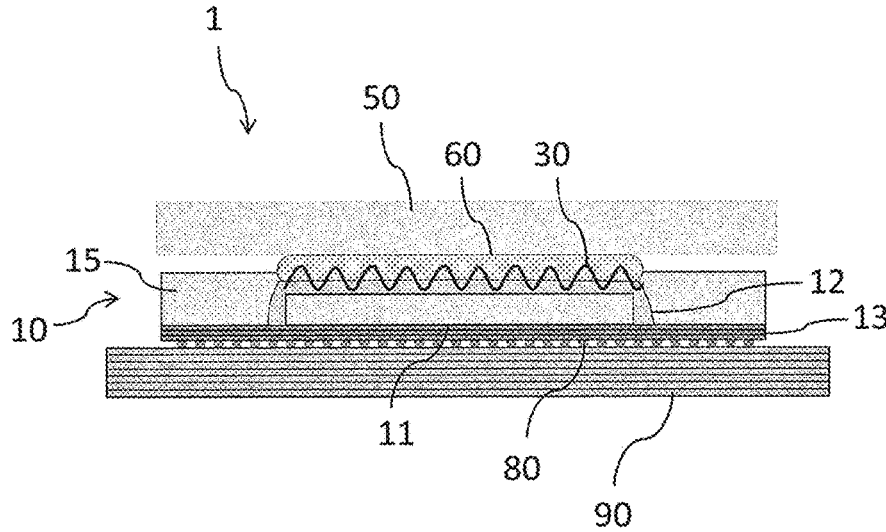
FIG. 11 is a side cross-sectional view illustrating an aspect in which the fiber member joins the heat transfer member placed on a device resin part and the device part in the electronic device according to an embodiment of the present invention.
Figure 12A:
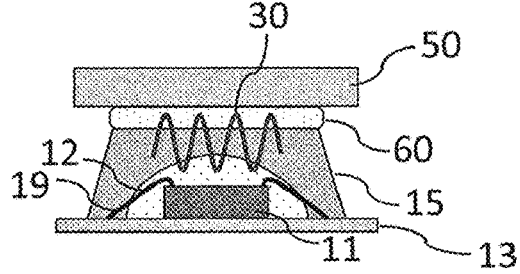
FIG. 12A is a view illustrating an example of the electronic device according to an embodiment of the present invention.
Figure 12B:
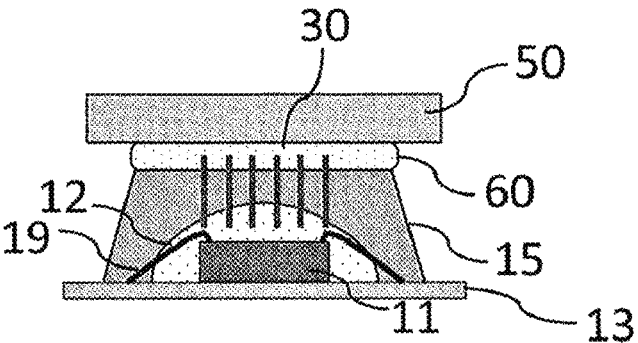
FIG. 12B is a view illustrating an example of the electronic device according to an embodiment of the present invention.
Figure 12C:
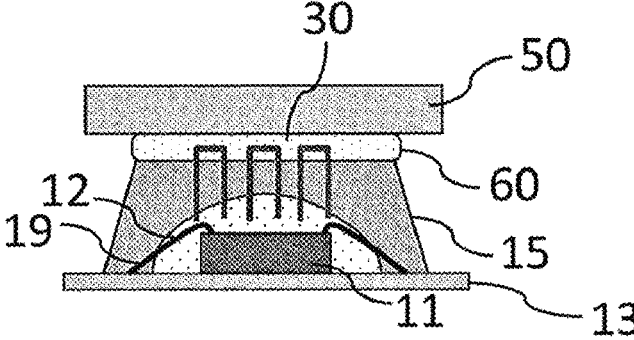
FIG. 12C is a view illustrating an example of the electronic device according to an embodiment of the present invention.
Figure 12D:
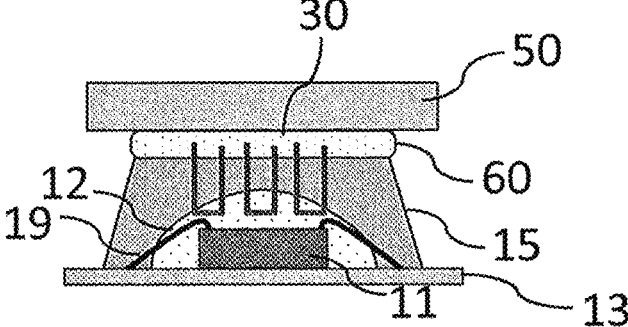
FIG. 12D is a view illustrating an example of the electronic device according to an embodiment of the present invention.
Figure 12E:
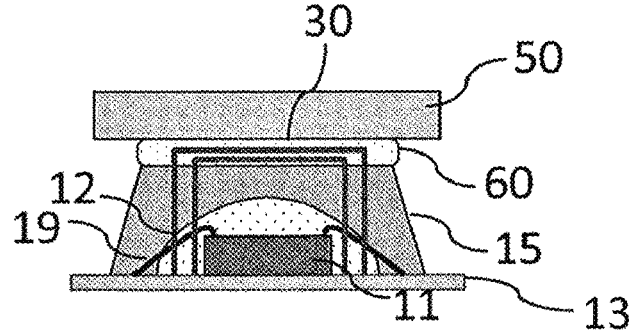
FIG. 12E is a view illustrating an example of the electronic device according to an embodiment of the present invention.
Figure 13A:
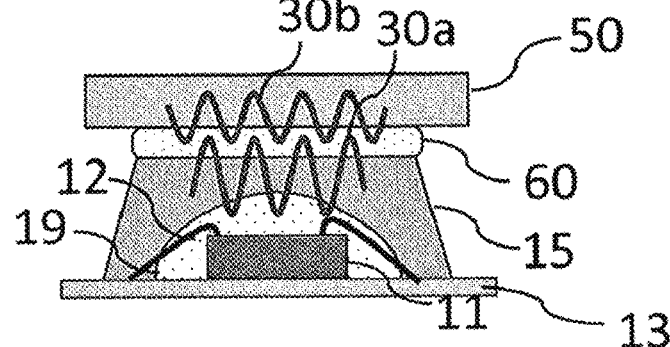
FIG. 13A is a view illustrating an example of the electronic device according to an embodiment of the present invention.
Figure 13B:
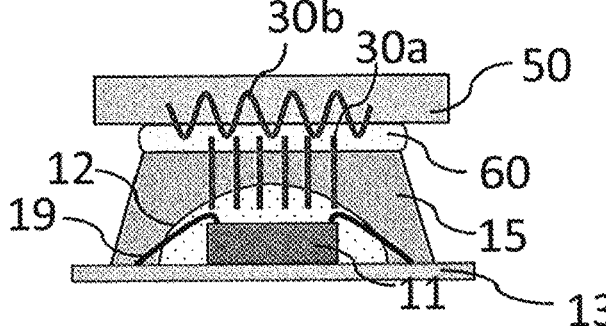
FIG. 13B is a view illustrating an example of the electronic device according to an embodiment of the present invention.
Figure 13C:
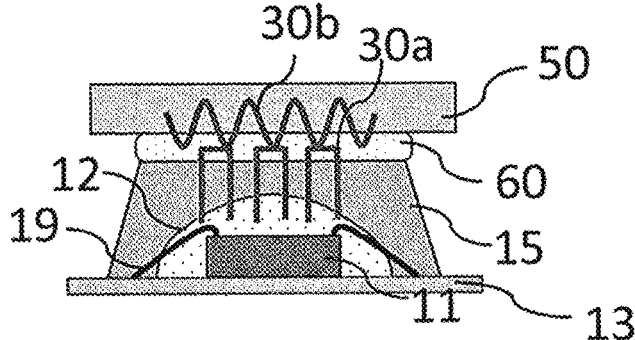
FIG. 13C is a view illustrating an example of the electronic device according to an embodiment of the present invention.
Figure 13D:
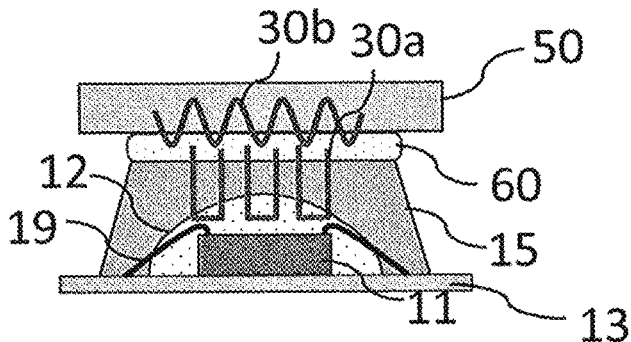
FIG. 13D is a view illustrating an example of the electronic device according to an embodiment of the present invention.
Figure 13E:
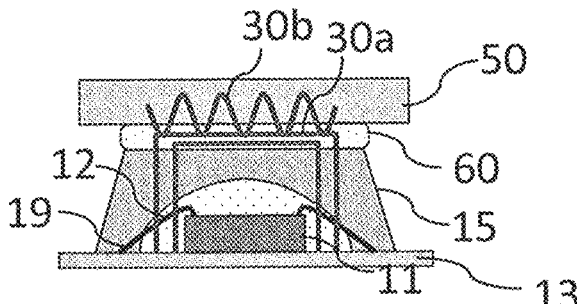
FIG. 13E is a view illustrating an example of the electronic device according to an embodiment of the present invention.
Figure 14A:
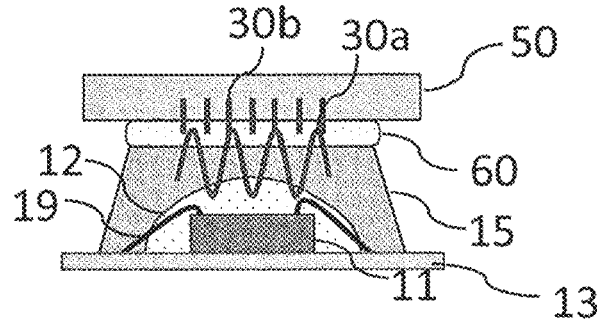
FIG. 14A is a view illustrating an example of the electronic device according to an embodiment of the present invention.
Figure 14B:
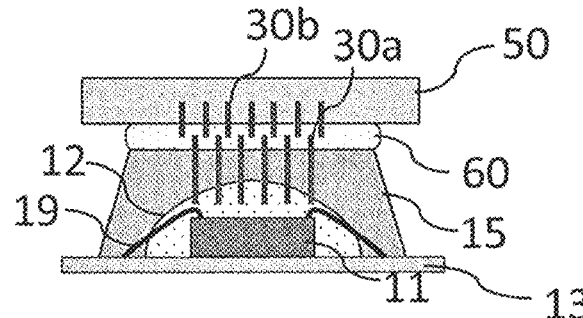
FIG. 14B is a view illustrating an example of the electronic device according to an embodiment of the present invention.
Figure 14C:
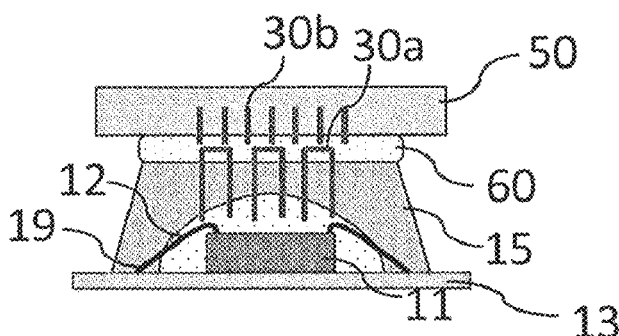
FIG. 14C is a view illustrating an example of the electronic device according to an embodiment of the present invention.
Figure 14D:
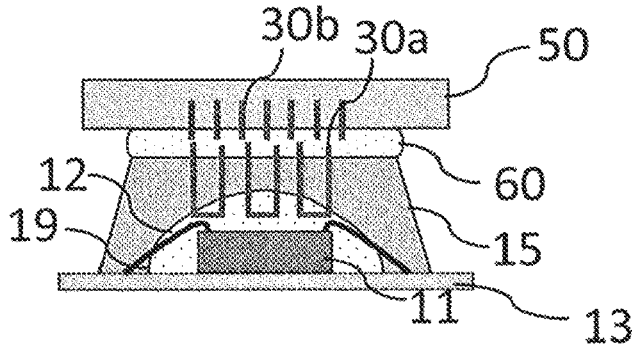
FIG. 14D is a view illustrating an example of the electronic device according to an embodiment of the present invention.
Figure 14E:
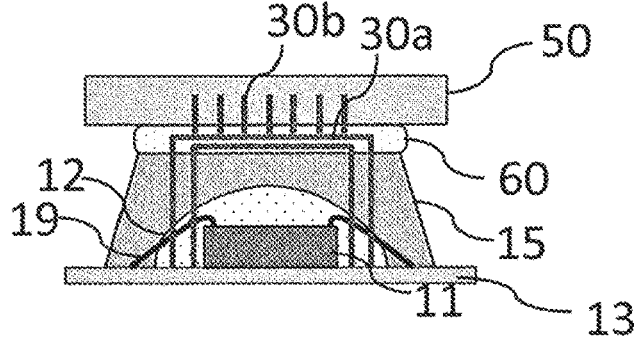
FIG. 14E is a view illustrating an example of the electronic device according to an embodiment of the present invention.
Figure 15A:
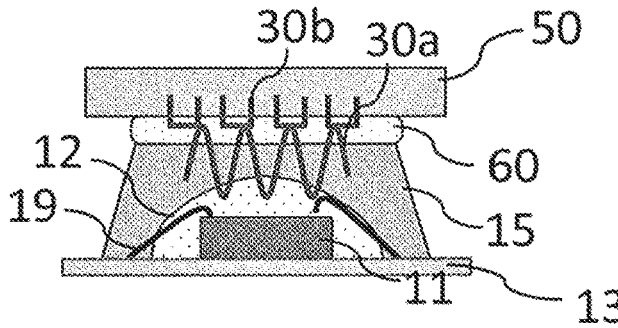
FIG. 15A is a view illustrating an example of the electronic device according to an embodiment of the present invention.
Figure 15B:
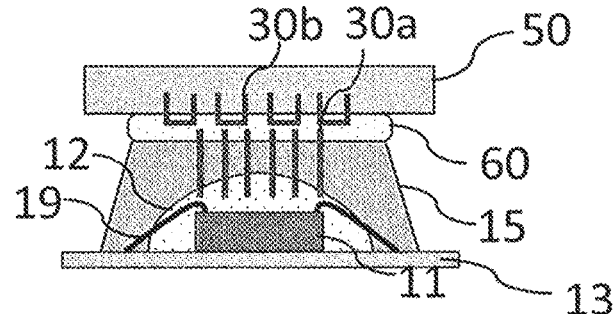
FIG. 15B is a view illustrating an example of the electronic device according to an embodiment of the present invention.
Figure 15C:
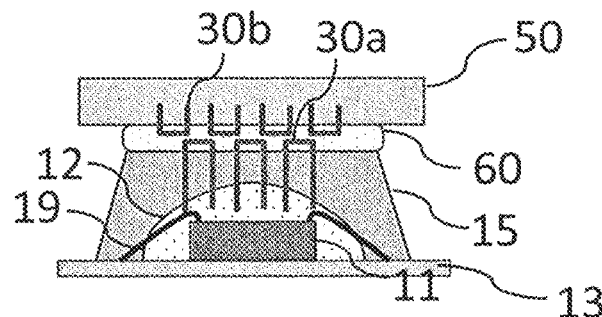
FIG. 15C is a view illustrating an example of the electronic device according to an embodiment of the present invention.
Figure 15D:
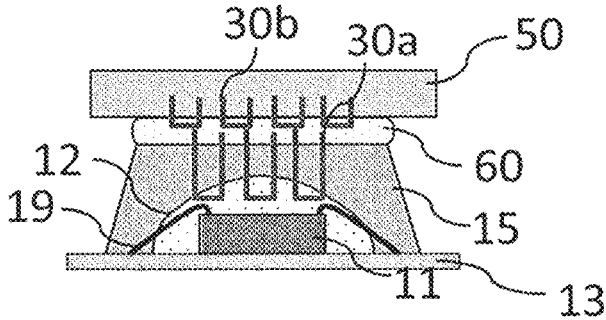
FIG. 15D is a view illustrating an example of the electronic device according to an embodiment of the present invention.
Figure 15E:
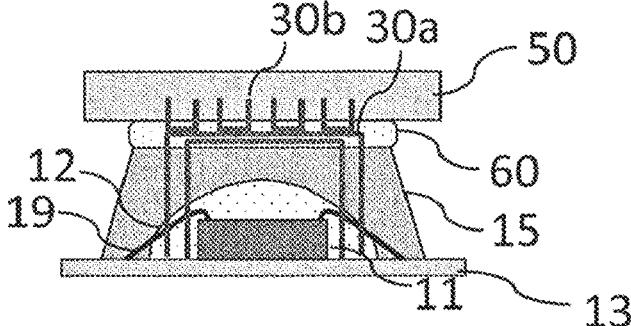
FIG. 15E is a view illustrating an example of the electronic device according to an embodiment of the present invention.
Figure 16A:
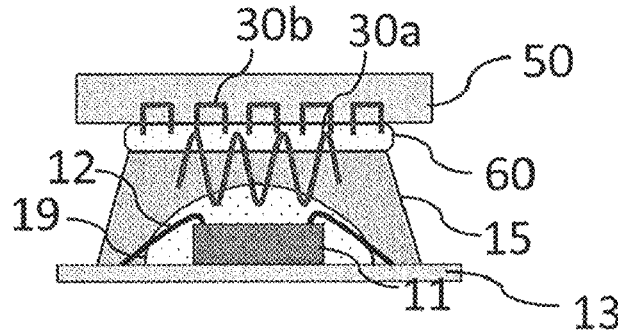
FIG. 16A is a view illustrating an example of the electronic device according to an embodiment of the present invention.
Figure 16B:
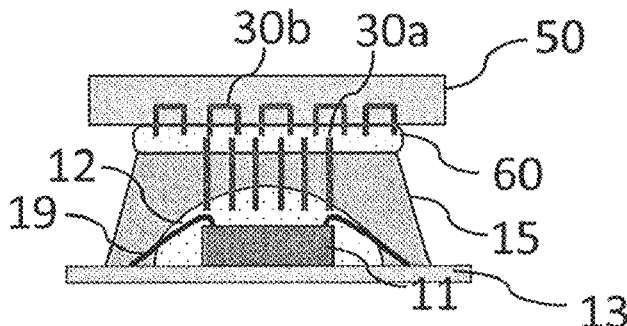
FIG. 16B is a view illustrating an example of the electronic device according to an embodiment of the present invention.
Figure 16C:
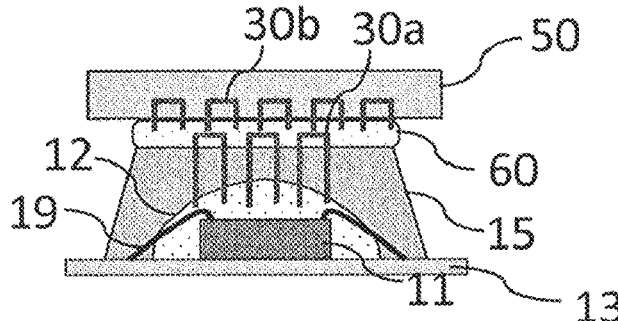
FIG. 16C is a view illustrating an example of the electronic device according to an embodiment of the present invention.
Figure 16D:
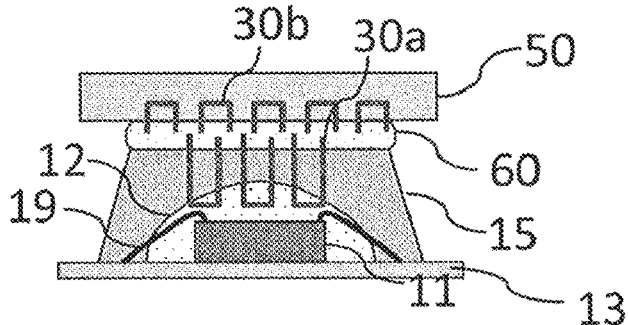
FIG. 16D is a view illustrating an example of the electronic device according to an embodiment of the present invention.
Figure 16E:
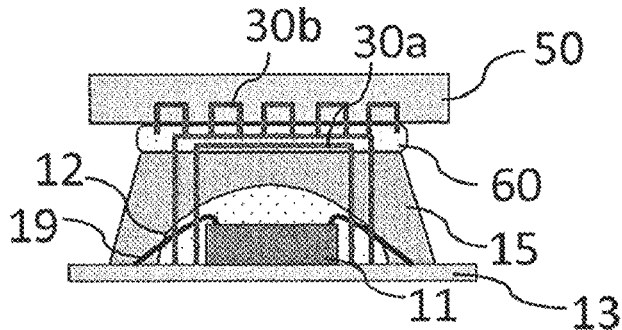
FIG. 16E is a view illustrating an example of the electronic device according to an embodiment of the present invention.
Figure 17A:
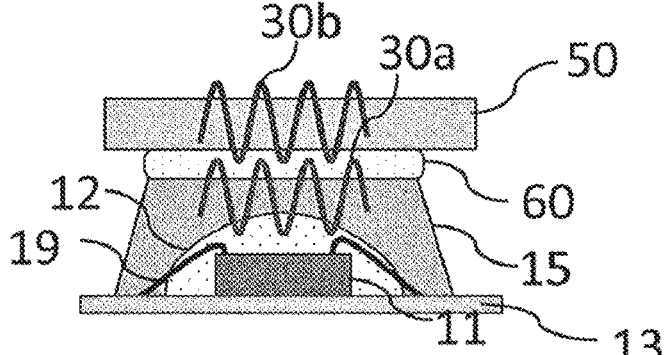
FIG. 17A is a view illustrating an example of the electronic device according to an embodiment of the present invention.
Figure 17B:
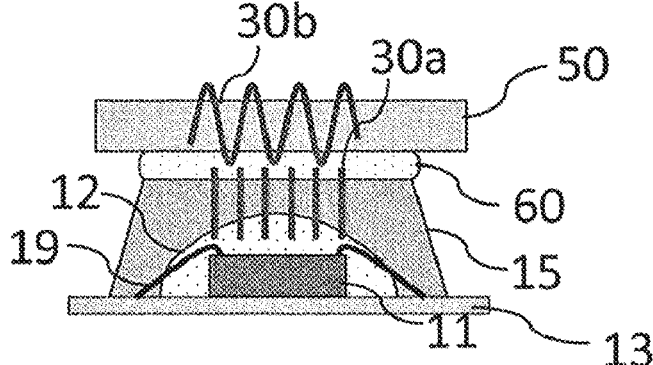
FIG. 17B is a view illustrating an example of the electronic device according to an embodiment of the present invention.
Figure 17C:
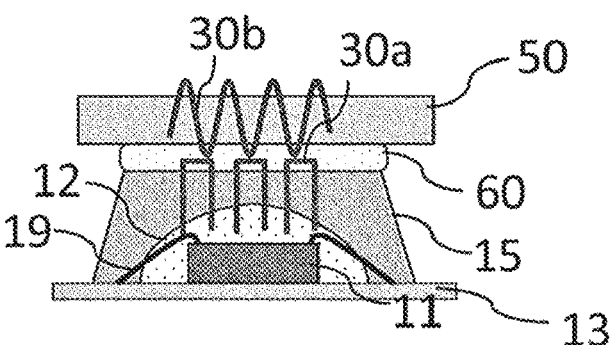
FIG. 17C is a view illustrating an example of the electronic device according to an embodiment of the present invention.
Figure 17D:
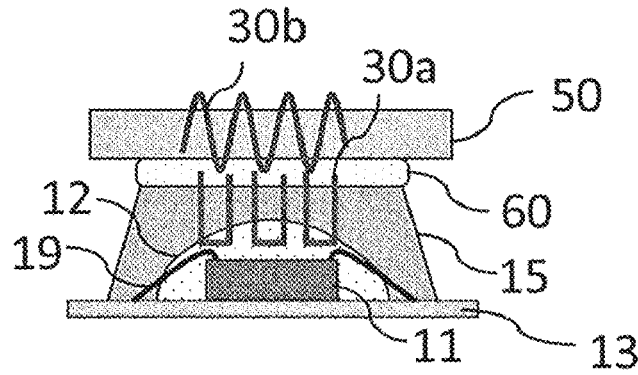
FIG. 17D is a view illustrating an example of the electronic device according to an embodiment of the present invention.
Figure 17E:
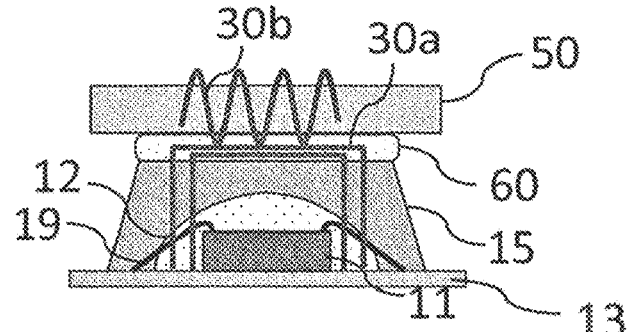
FIG. 17E is a view illustrating an example of the electronic device according to an embodiment of the present invention.
Figure 18A:
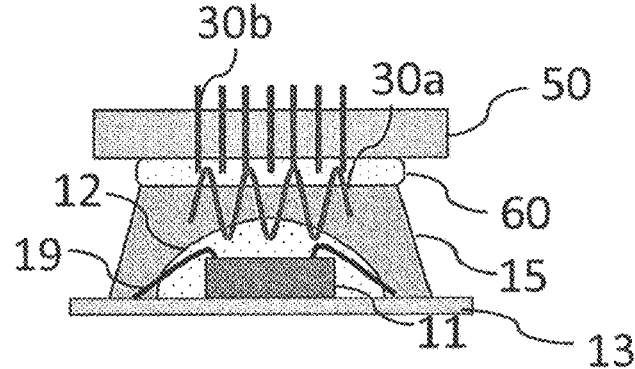
FIG. 18A is a view illustrating an example of the electronic device according to an embodiment of the present invention.
Figure 18B:
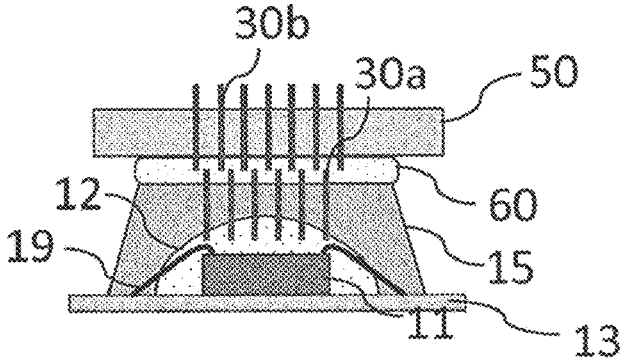
FIG. 18B is a view illustrating an example of the electronic device according to an embodiment of the present invention.
Figure 18C:
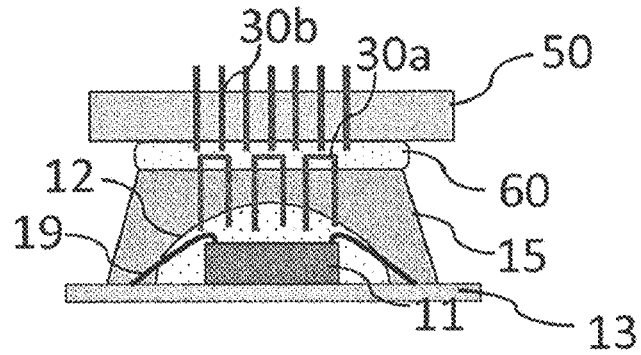
FIG. 18C is a view illustrating an example of the electronic device according to an embodiment of the present invention.
Figure 18D:
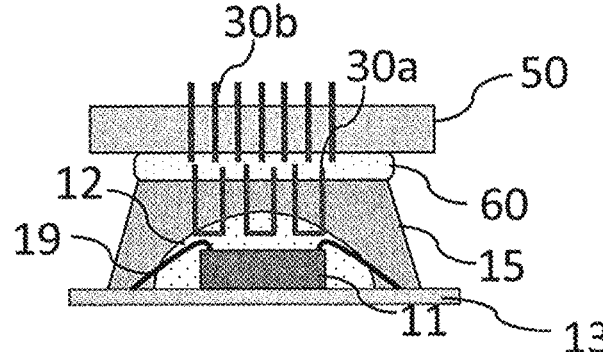
FIG. 18D is a view illustrating an example of the electronic device according to an embodiment of the present invention.
Figure 18E:
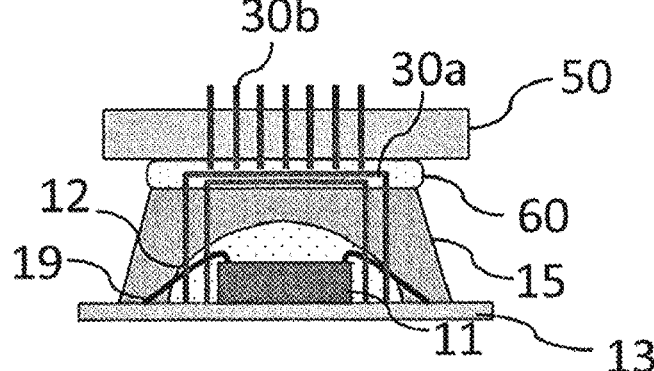
FIG. 18E is a view illustrating an example of the electronic device according to an embodiment of the present invention.
Figure 19A:
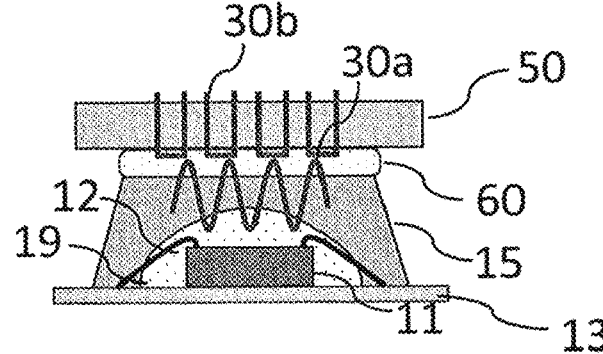
FIG. 19A is a view illustrating an example of the electronic device according to an embodiment of the present invention.
Figure 19B:
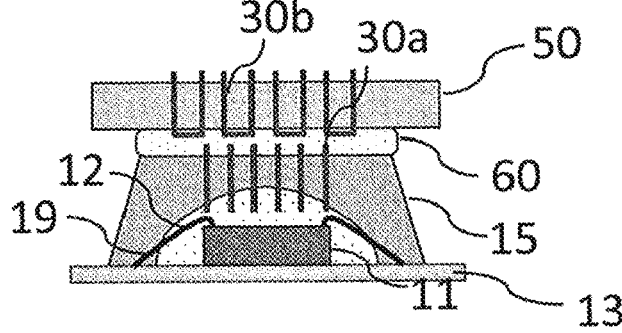
FIG. 19B is a view illustrating an example of the electronic device according to an embodiment of the present invention.
Figure 19C:
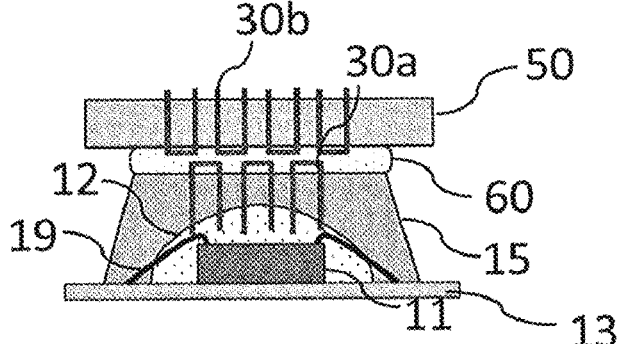
FIG. 19C is a view illustrating an example of the electronic device according to an embodiment of the present invention.
Figure 19D:
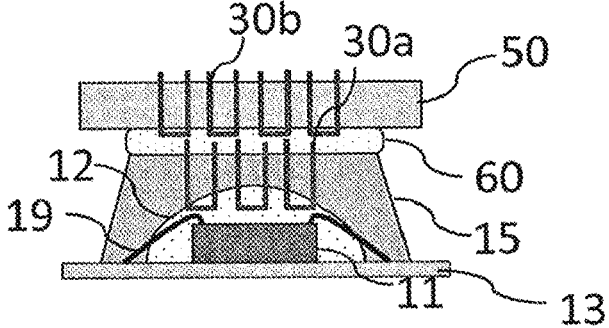
FIG. 19D is a view illustrating an example of the electronic device according to an embodiment of the present invention.
Figure 19E:
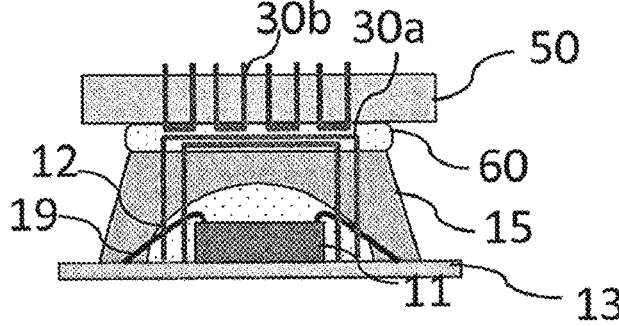
FIG. 19E is a view illustrating an example of the electronic device according to an embodiment of the present invention.
Figure 20A:
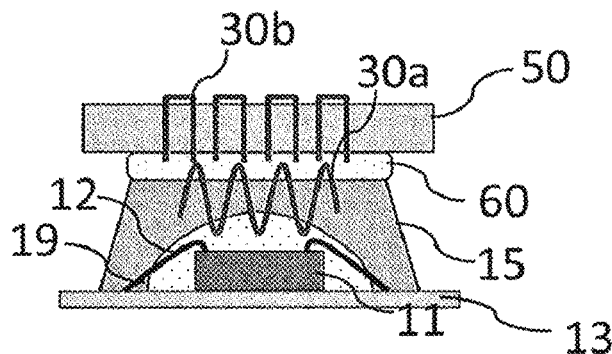
FIG. 20A is a view illustrating an example of the electronic device according to an embodiment of the present invention.
Figure 20B:
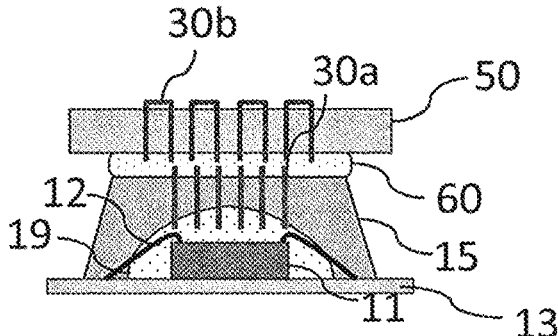
FIG. 20B is a view illustrating an example of the electronic device according to an embodiment of the present invention.
Figure 20C:
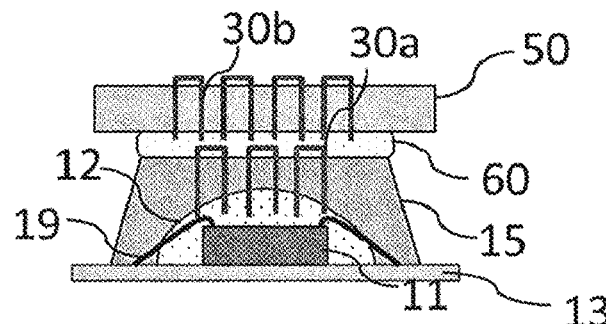
FIG. 20C is a view illustrating an example of the electronic device according to an embodiment of the present invention.
Figure 20D:
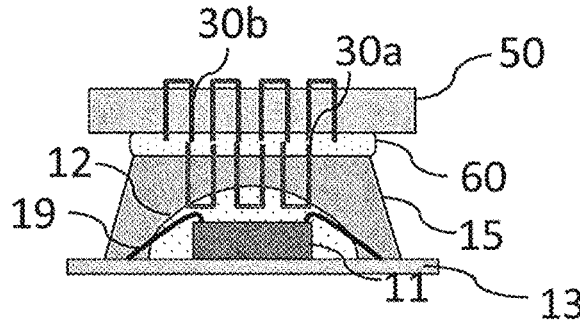
FIG. 20D is a view illustrating an example of the electronic device according to an embodiment of the present invention.
Figure 20E:
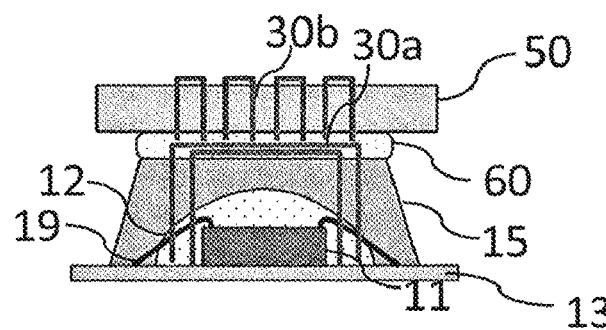
FIG. 20E is a view illustrating an example of the electronic device according to an embodiment of the present invention.
Figure 21A:
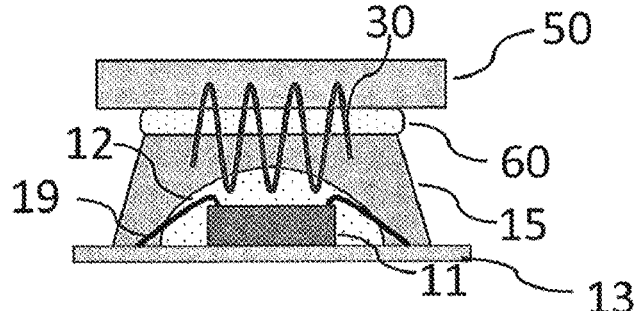
FIG. 21A is a view illustrating an example of the electronic device according to an embodiment of the present invention.
Figure 21B:
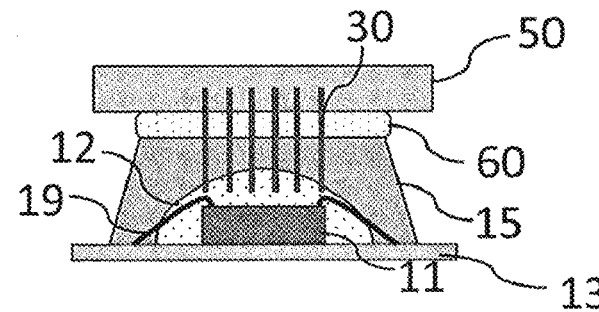
FIG. 21B is a view illustrating an example of the electronic device according to an embodiment of the present invention.
Figure 21C:
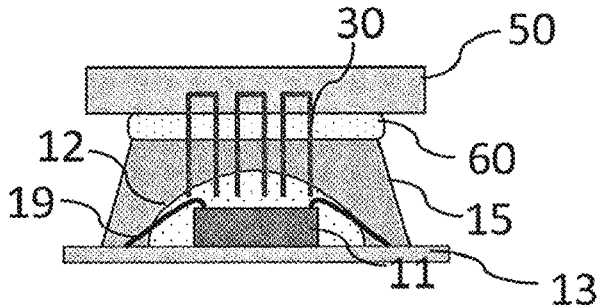
FIG. 21C is a view illustrating an example of the electronic device according to an embodiment of the present invention.
Figure 21D:
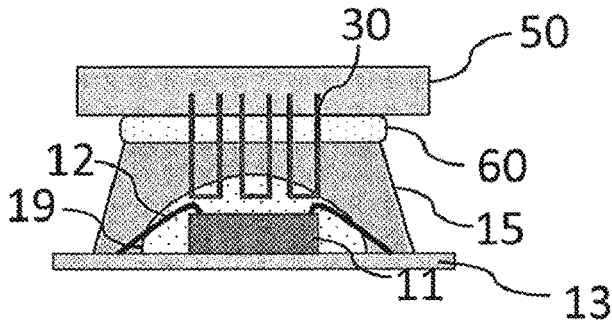
FIG. 21D is a view illustrating an example of the electronic device according to an embodiment of the present invention.
Figure 22A:
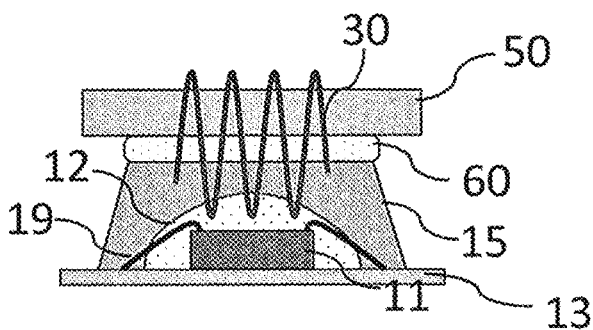
FIG. 22A is a view illustrating an example of the electronic device according to an embodiment of the present invention.
Figure 22B:
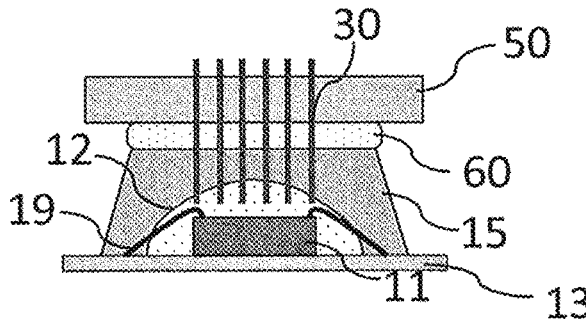
FIG. 22B is a view illustrating an example of the electronic device according to an embodiment of the present invention.
Figure 22C:
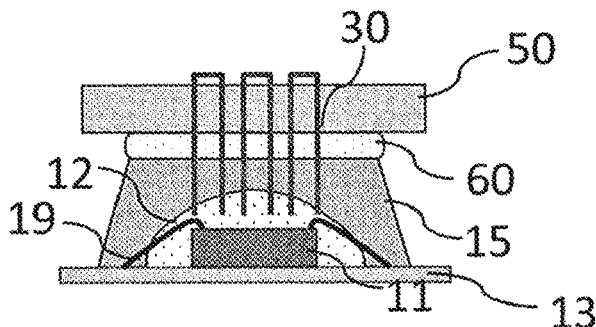
FIG. 22C is a view illustrating an example of the electronic device according to an embodiment of the present invention.
Figure 22D:
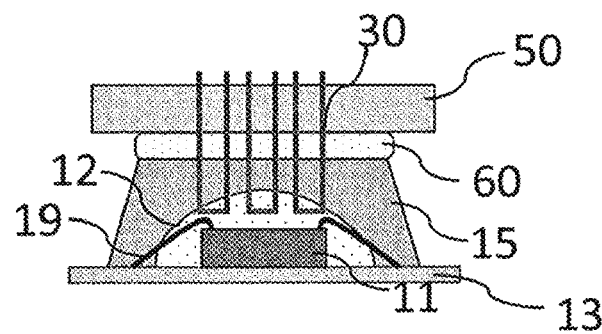
FIG. 22D is a view illustrating an example of the electronic device according to an embodiment of the present invention.

As illustrated in FIGS. 1 to 3, a heat transfer member 60 such as grease (for example, thermally conductive grease (thermal interface material (TIM)) or a heat dissipation sheet may be provided between the device part 10 and the outer housing 50. In this case, the another member may include the heat transfer member 60, and the fiber member 30 may join the device part 10 and the heat transfer member 60 (see also FIG. 11). Also in this case, the joining by the fiber member 30 may be implemented by a special sewing machine.

Also in an aspect in which the fiber member 30 joins the device part 10 and the heat transfer member 60 as described above, heat can be efficiently transferred to the heat transfer member 60 via the fiber member 30. Therefore, a greater heat dissipation effect can be exhibited.

In a case where the heat transfer member 60 is provided, as illustrated in FIG. 2, the fiber member 30 may penetrate through the heat transfer member 60 to reach the outer housing 50. In this case, the fiber member 30 joins the device part 10 to the outer housing 50 and the heat transfer member 60. Also in this case, the fiber member 30 may be exposed from the one side surface (outer surface) of the outer housing 50 as illustrated in FIG. 3, or the fiber member 30 may not be exposed from the one side surface (outer surface) of the outer housing 50 as illustrated in FIG. 2. Also in this case, as described above, heat can be transferred to the outer housing 50 via the fiber member 30, and a greater heat dissipation effect can be exhibited.

The device part 10 may have an electronic element 11 such as a semiconductor chip, a resistor, or a capacitor, and a device resin part 12 that covers and encloses the electronic element 11. The device resin part 12 may be made of a resin such as a potting resin. In this case, the fiber member 30 may join the device resin part 12 of the device part 10 to another member (the outer housing 50, the heat transfer member 60, or the like) other than the device part 10 included in the electronic device (see FIGS. 1 to 4). The device resin part 12 is advantageous in that sewing by the fiber member 30 is easy. In addition, in a case where the fiber member 30 is made of metal or the like and has electrical conductivity, when the electronic element 11 and the fiber member 30 are joined, there is a possibility of causing a short circuit. However, such a risk can be reduced by sewing the fiber member 30 to the device resin part 12 as in this aspect. The device part 10 may have a device substrate 13 on which the electronic element 11 is placed. A circuit may be formed on the device substrate 13. The device substrate 13 may be placed on a mounting substrate 90 via a conductive adhesive 80 such as a solder.

The device part 10 may have a device housing 15 that covers the electronic element 11. In this case, the fiber member 30 may join the device housing 15 of the device part 10 and another member (the outer housing 50, the heat transfer member 60, or the like) other than the device part 10 included in the electronic device. In addition, in a case where the fiber member 30 is made of metal or the like and has electrical conductivity, when the electronic element 11 and the fiber member 30 are joined, there is a possibility of causing a short circuit. However, such a risk can be reduced by sewing the fiber member 30 to the device housing 15 as in this aspect.

In a case where the device part 10 has the device resin part 12 that covers and encloses the electronic element 11 and the device housing 15 that covers the device resin part 12, the fiber member 30 may join the device resin part 12 and the device housing 15 of the device part 10 to another member (the outer housing 50, the heat transfer member 60, or the like) other than the device part 10 included in the electronic device. A wire 19 (see FIGS. 12A to 21E) or a connector may be connected to the electronic element 11 and connected to a circuit made of copper or the like.

Figure 5:
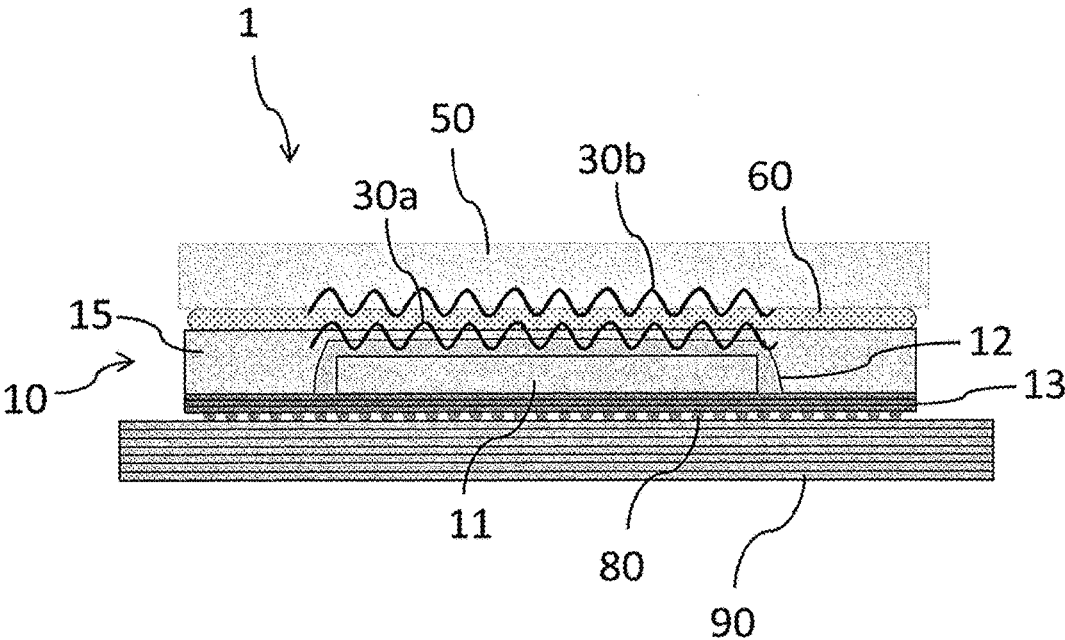
FIG. 5 is a side cross-sectional view illustrating an aspect in which a certain fiber member joins the device part and the heat transfer member, and another fiber member joins the heat transfer member and the outer housing in the electronic device according to an embodiment of the present invention.
Figure 5:
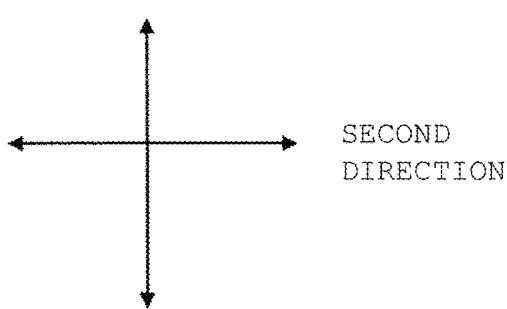

As illustrated in FIG. 5, a certain fiber member (first fiber member) 30a may join the device part 10 and the heat transfer member 60, and another fiber member (second fiber member) 30b may join the heat transfer member 60 and the outer housing 50. In this case, thermal conduction from the device part 10 to the heat transfer member 60 can be implemented by the certain fiber member (first fiber member) 30a, and thermal conduction from the heat transfer member 60 to the outer housing 50 can be implemented by the another fiber member (second fiber member) 30b.

Figure 6:
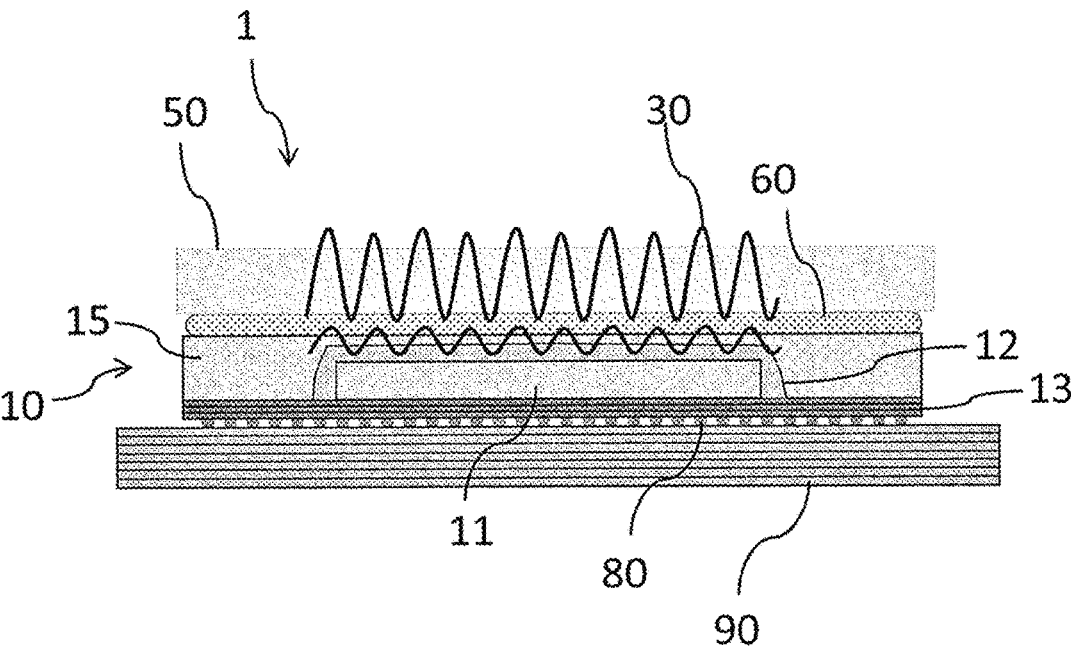
FIG. 6 is a side cross-sectional view illustrating an aspect in which the fiber member joins the device part and the heat transfer member, and another fiber member joins the heat transfer member and the outer housing, in an electronic device according to an embodiment of the present invention, in which the fiber member penetrates through the outer housing.

As illustrated in FIG. 6, the another fiber member (second fiber member) 30b may be exposed to the outside from the outer housing 50. Since the another fiber member (second fiber member) 30b is exposed to the outside in this manner, heat can be easily released to the outside.

Figure 7:
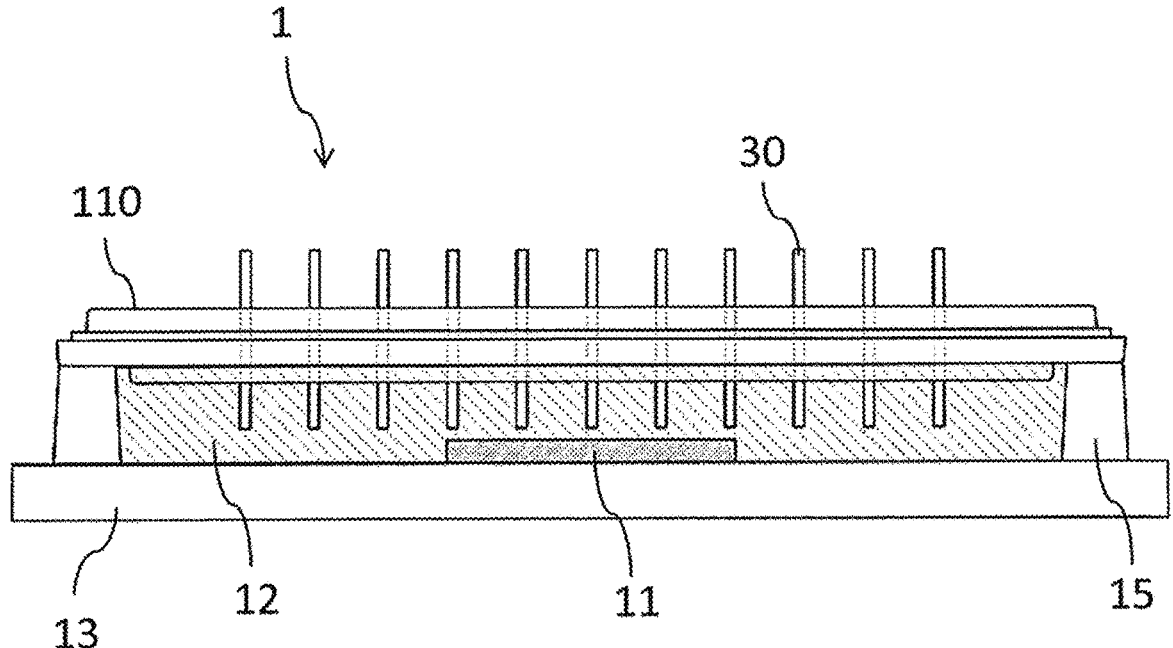
FIG. 7 is a side cross-sectional view illustrating an aspect in which the fiber member having a rod shape penetrates through the outer housing in the electronic device according to an embodiment of the present invention.
Figure 8:
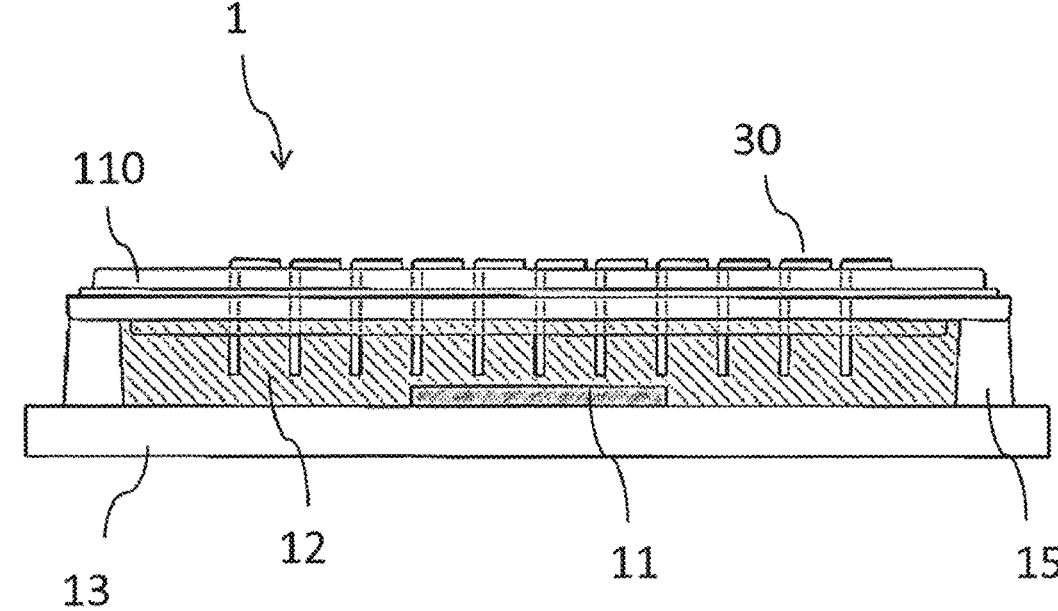
FIG. 8 is a side cross-sectional view illustrating an aspect in which the fiber member having a rod shape is bent on a front surface of the outer housing in the electronic device according to an embodiment of the present invention.
Figure 9:
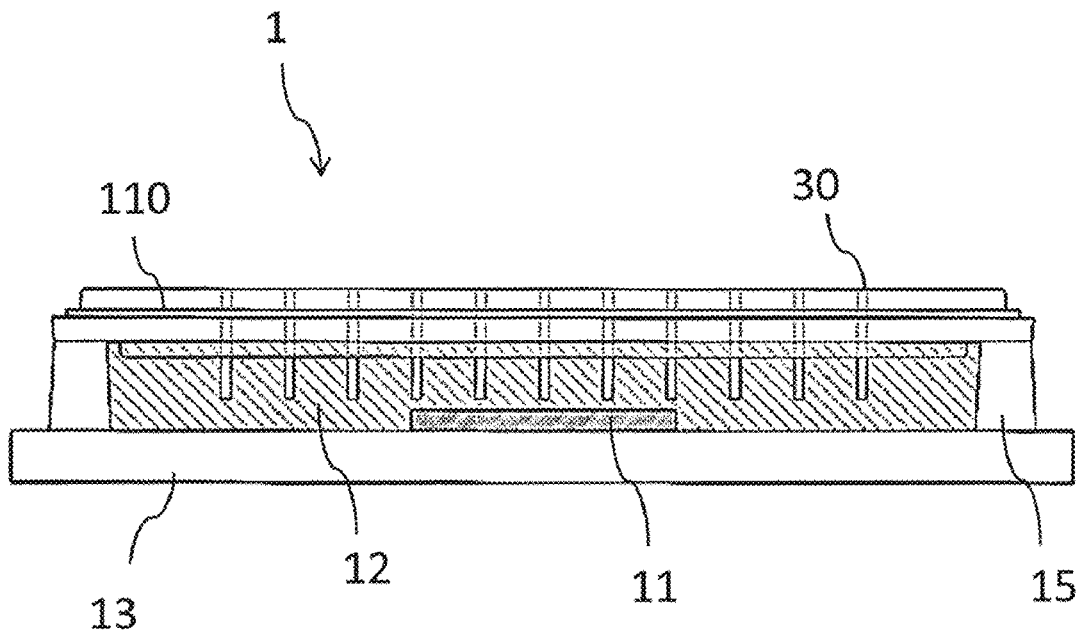
FIG. 9 is a side cross-sectional view illustrating an aspect in which the fiber member having a rod shape is cut at a position exposed from the outer housing in the electronic device according to an embodiment of the present invention.

As illustrated in FIGS. 7 to 9, the fiber member 30 of the present embodiment may be a rod-shaped member. In this aspect, the rod-shaped fiber member 30 pierces and penetrates through another member, whereby the device part 10 is joined to the another member. The device part 10 may be joined to the another member by providing an adhesive or the like between the fiber member 30 and the another member. The rod-shaped fiber member 30 may have a bent shape (see FIGS. 12C to 12E, FIGS. 13C to 13E, FIGS. 14C to 14E, and the like). For example, the rod-shaped fiber member 30 may have a U-shape when viewed in a cross section.

The rod-shaped fiber member 30 does not have to be exposed or may be exposed from a front surface side of the electronic device. In a case where the rod-shaped fiber member 30 is exposed from the front surface side of the electronic device, the fiber member 30 may protrude from one side surface (front surface) (see FIG. 7), the fiber member 30 may be bent on the one side surface (front surface) of the electronic device (see FIG. 8), or a protruding part of the fiber member 30 may be cut (see FIG. 9). In the aspects illustrated in FIGS. 7 to 9, the electronic device 1 has a lid part 110. In the aspect illustrated in FIG. 7, the fiber member 30 penetrates through the lid part 110. In the aspect illustrated in FIG. 8, the fiber member 30 is bent along one side surface of the lid part 110. In the aspect illustrated in FIG. 9, the fiber member 30 is cut at a position exposed from the one side surface of the lid part 110.

Figure 10:
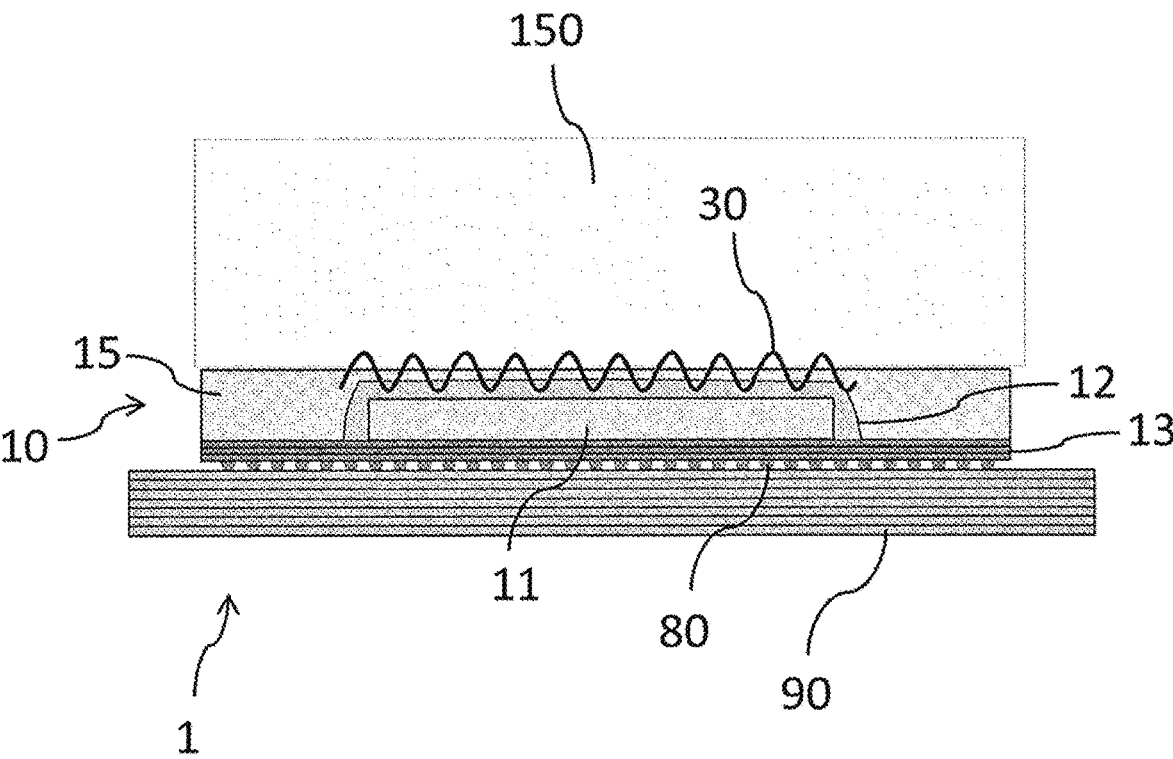
FIG. 10 is a side cross-sectional view illustrating an aspect in which the fiber member joins the device part and a heat sink in the electronic device according to an embodiment of the present invention.

As illustrated in FIG. 10, the another member joined by the fiber member 30 may be a heat sink 150 or the like. This case is advantageous in that heat from the device part 10 can be directly transferred to the heat sink 150.

In the present embodiment, various aspects can be used. Examples of an adoptable aspect are disclosed in FIGS. 12A to 22E.

As described above, according to the present embodiment, heat retained in the device part 10 can be efficiently conducted from the inside to the outside through a highly thermally conductive fiber or substance. In addition, as the protrusion and the highly thermally conductive fiber are entangled with the thermally conductive grease or the like, a surface area for transferring heat is increased, more heat is transferred, and the thermal conductivity can be improved.

In a case where the fiber member 30 is made of a highly thermally conductive fiber, the heat dissipation effect is further enhanced. It is possible to pick up heat from the periphery of a heating part such as the device part 10 and transfer the heat to a resin having poor thermal conductivity and the outside of an IC package or a module to transfer the heat to the grease or the housing. As in the present embodiment, it is very advantageous to expose the fiber to the outside of the housing and the like to dissipate heat, in addition to a case of transferring the heat to other components or members and the housing.

Examples of a main electronic device in which the present embodiment is used include a power transistor molded from resin, a central processing unit (CPU) molded from a resin, a graphics processing unit (GPU) molded from a resin, a memory molded from a resin, and a resin package module.

The electronic device of the present embodiment may be incorporated into any mounting apparatus such as an automobile, an airplane, a ship, a helicopter, a personal computer, or a home appliance. In addition, an insulating printed circuit board, a house, or the like using the sealing material as in the present embodiment may be provided.

The description of each embodiment and the disclosure of the figures described above are merely examples for describing the invention described in the claims, and the invention described in the claims is not limited by the description of the embodiments or the disclosure of the figures described above.

REFERENCE SIGNS LIST

10 Device part
11 Electronic element
12 Device resin part
15 Device housing
30 Fiber member (for example, highly thermally conductive fiber)
50 Outer housing
60 Heat transfer member

The invention claimed is:

1. An electronic device comprising:
a device part;
an outer housing provided to cover an upper side of the device part; and
a fiber member for joining the device part to the outer housing,
wherein the fiber member is exposed from an upper surface of the outer housing.

2. The electronic device according to claim 1, wherein the fiber member is made of metal.

3. The electronic device according to claim 1, wherein the device part has an electronic element, and a device resin part that covers the electronic element, and wherein the fiber member joins the device resin part of the device part with the outer housing.

4. The electronic device according to claim 1, wherein the device part has an electronic element, and a device housing that covers the electronic element, and wherein the fiber member joins the device housing part of the device part with the outer housing.

5. An electronic device comprising:
a device part;
an outer housing provided to cover an upper side of the device part;
a heat transfer member provided between the upper side of the device part and the outer housing; and
a fiber member for joining the device part to the heat transfer member.

6. The electronic device according to claim 5, wherein the fiber member joins the device part with the outer housing and the heat transfer member.

7. The electronic device according to claim 5, wherein the device part has an electronic element, and a device resin part that covers the electronic element, and wherein the fiber member joins the device resin part of the device part with the heat transfer member.

8. The electronic device according to claim 5, wherein the device part has an electronic element, and a device housing that covers the electronic element, and wherein the fiber member joins the device housing part of the device part with the heat transfer member.

* * * * *